United States Patent
Seki et al.

(10) Patent No.: US 11,121,444 B2
(45) Date of Patent: Sep. 14, 2021

(54) DIRECTIONAL COUPLER

(71) Applicant: Murata Manufacturing Co., Ltd., Kyoto (JP)

(72) Inventors: Kenta Seki, Kyoto (JP); Ryangsu Kim, Kyoto (JP); Katsuya Shimizu, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 4 days.

(21) Appl. No.: 16/552,360

(22) Filed: Aug. 27, 2019

(65) Prior Publication Data
US 2020/0076045 A1 Mar. 5, 2020

(30) Foreign Application Priority Data
Aug. 31, 2018 (JP) .............................. JP2018-163259

(51) Int. Cl.
| | |
|---|---|
| *H01P 5/18* | (2006.01) |
| *H03H 7/01* | (2006.01) |
| *H03H 7/38* | (2006.01) |
| *H03F 3/189* | (2006.01) |
| *H01P 1/201* | (2006.01) |
| *H04B 1/00* | (2006.01) |

(52) U.S. Cl.
CPC .............. *H01P 5/187* (2013.01); *H01P 1/201* (2013.01); *H03F 3/189* (2013.01); *H03H 7/0115* (2013.01); *H03H 7/38* (2013.01); *H04B 1/006* (2013.01)

(58) Field of Classification Search
CPC .. H01P 5/18; H01P 5/187; H03H 7/01; H03H 7/38; H03H 11/24

USPC .................................. 333/109–112, 116, 101
See application file for complete search history.

(56) References Cited

U.S. PATENT DOCUMENTS

| | | | |
|---|---|---|---|
| 6,085,071 A | 7/2000 | Yamada et al. | |
| 9,954,564 B2 | 4/2018 | Little et al. | |
| 2008/0048046 A1* | 2/2008 | Wagner | G05D 23/1904 236/91 R |

(Continued)

FOREIGN PATENT DOCUMENTS

| | | |
|---|---|---|
| CN | 1198612 A | 11/1998 |
| CN | 203233497 U | 10/2013 |

(Continued)

OTHER PUBLICATIONS

Office Action for Japanese Patent Application No. 2018-163259 dated Dec. 15, 2020.

(Continued)

*Primary Examiner* — Dean O Takaoka
(74) *Attorney, Agent, or Firm* — Pearne & Gordon LLP

(57) ABSTRACT

A directional coupler includes a main line for transmitting a high frequency signal, a sub line electromagnetically coupled to the main line, a termination circuit for terminating one end portion of the sub line, and a variable filter that has an input terminal and an output terminal and the input terminal is connected to another end portion of the sub line. The variable filter is a filter unit circuit having one frequency band as a pass band or a stop band, and in the filter unit circuit, a variable passive element for shifting a frequency in the pass band or the stop band is disposed.

13 Claims, 15 Drawing Sheets

(56) References Cited

U.S. PATENT DOCUMENTS

| | | | | |
|---|---|---|---|---|
| 2014/0327496 | A1* | 11/2014 | Zuo | H03H 7/0115 |
| | | | | 333/132 |
| 2017/0094607 | A1* | 3/2017 | Ripley | H04B 17/101 |
| 2017/0230066 | A1 | 8/2017 | Little et al. | |
| 2017/0250723 | A1* | 8/2017 | Srirattana | H01P 5/02 |
| 2017/0288707 | A1* | 10/2017 | Yun | H03H 3/00 |
| 2017/0373368 | A1* | 12/2017 | Srirattana | H04B 1/006 |
| 2018/0006625 | A1* | 1/2018 | Kaminishi | H03H 7/0115 |

FOREIGN PATENT DOCUMENTS

| | | |
|---|---|---|
| JP | H07-321586 A | 12/1995 |
| JP | 2002-314360 A | 10/2002 |
| JP | 4217106 B2 | 1/2009 |

OTHER PUBLICATIONS

Office Action for CN Patent Application No. 201910787408.0 dated Mar. 1, 2021.

* cited by examiner

VARIABLE LOW PASS FILTER

VARIABLE HIGH PASS FILTER

VARIABLE BAND ELIMINATION FILTER

VARIABLE BAND PASS FILTER

VARIABLE LOW PASS FILTER

VARIABLE HIGH PASS FILTER

VARIABLE BAND PASS FILTER

VARIABLE BAND PASS FILTER

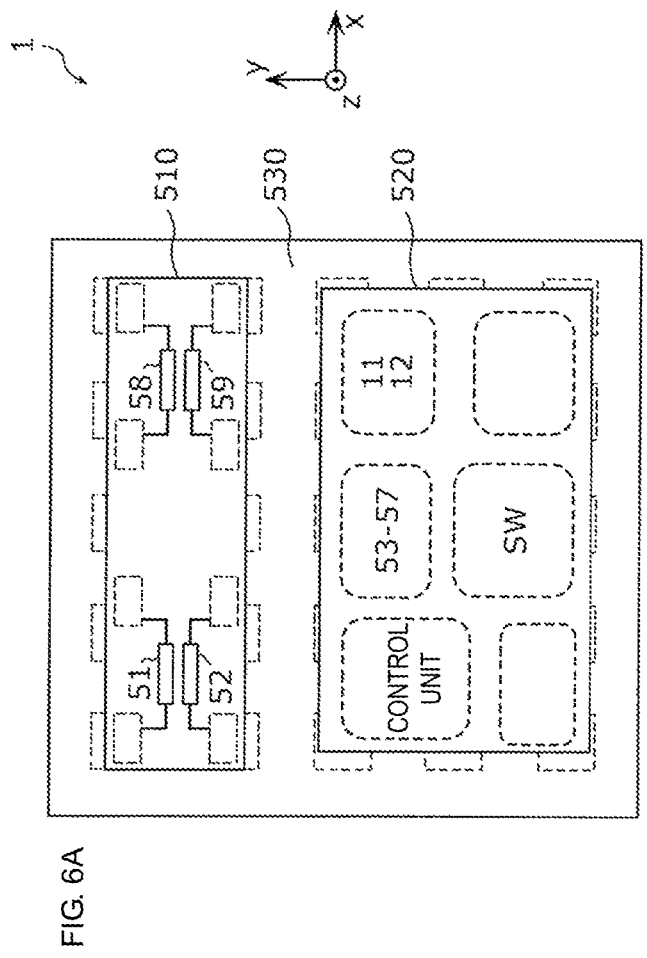

VARIABLE BAND PASS FILTER

VARIABLE BAND PASS FILTER

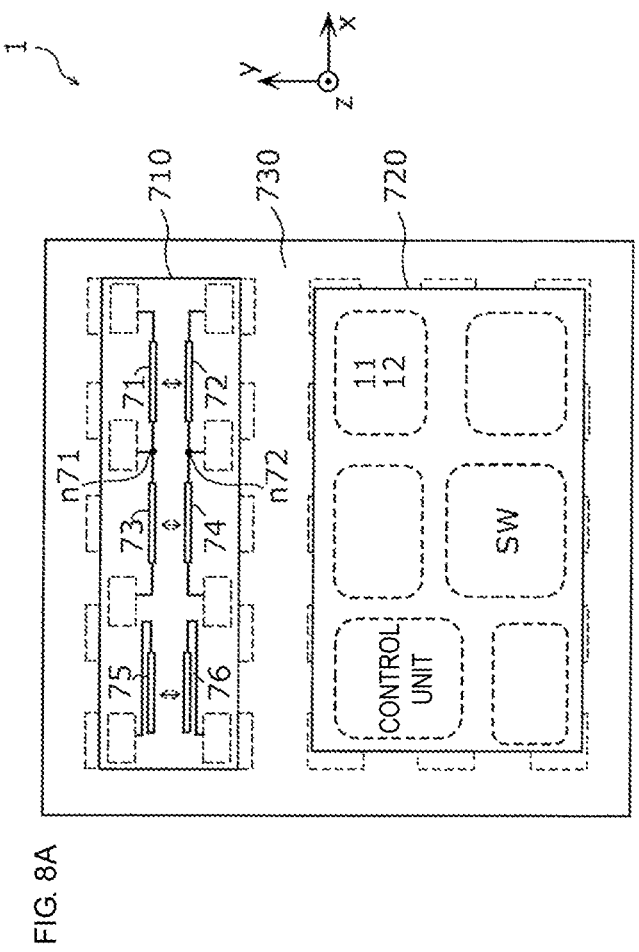

DIRECTIONAL COUPLER

This application claims priority from Japanese Patent Application No. 2018-163259 filed on Aug. 31, 2018. The content of this application is incorporated herein by reference in its entirety.

BACKGROUND

The present disclosure relates to a directional coupler.

In the past, an electromagnetic coupler (directional coupler) in which a filter circuit composed of a plurality of filters and a plurality of switches is connected to one end portion (coupling port) of a sub line has been known (see, for example, U.S. Pat. No. 9,954,564).

The plurality of switches selectively connect one filter of the plurality of filters to the sub line, and a high frequency signal in a desired frequency band can be detected without necessarily being interfered with a signal in other frequency bands.

However, in the above-described directional coupler in the past, a plurality of filters in which pass bands are fixed is disposed, so that there is a problem that the directional coupler is increased in size.

BRIEF SUMMARY

The present disclosure provides a directional coupler, whereas miniaturized, that detects a high frequency signal in a desired frequency band with high accuracy.

A directional coupler according to an aspect of the present disclosure includes a main line for transmitting a high frequency signal, a sub line electromagnetically coupled to the main line, a termination circuit for terminating one end portion of the sub line, and a variable filter that has an input terminal and an output terminal and the input terminal is connected to another end portion of the sub line. The variable filter is a filter unit circuit having one frequency band as a pass band or a stop band, and in the filter unit circuit, a variable passive element for shifting a frequency in the pass band or the stop band is disposed.

According to the present disclosure, it is possible to provide a directional coupler, whereas miniaturized, that detects a high frequency signal in a desired frequency band with high accuracy.

Other features, elements, characteristics and advantages of the present disclosure will become more apparent from the following detailed description of embodiments of the present disclosure with reference to the attached drawings.

BRIEF DESCRIPTION OF THE SEVERAL VIEWS OF THE DRAWINGS

FIGS. 6A to 6C are mounting configuration diagrams of a directional coupler including the variable filter of the fifth example according to Embodiment 1;

FIGS. 8A to 8C are mounting configuration diagrams of a directional coupler including the variable filter of the seventh example according to Embodiment 1;

DETAILED DESCRIPTION

Figure 1:
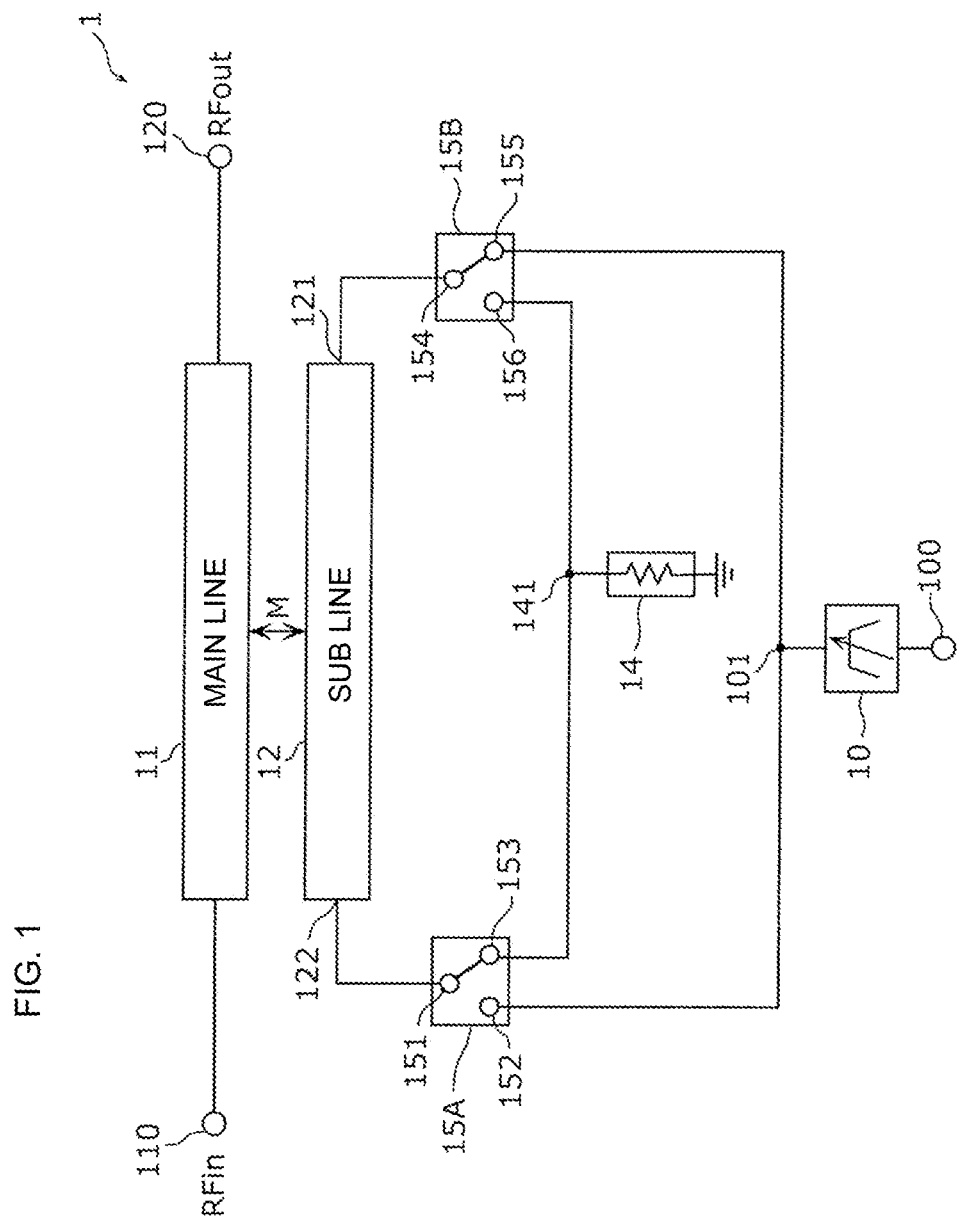
FIG. 1 is a circuit diagram illustrating an example of a functional configuration of a directional coupler according to Embodiment 1.

Hereinafter, embodiments and modification examples of the present disclosure will be described in detail with reference to the accompanying drawings. It should be noted that embodiments and modification examples thereof described below are intended to be inclusive or specific examples. Numerical values, shapes, materials, constituent elements, arrangement and connection forms of the constituent elements illustrated in the following embodiments and modification examples thereof are merely examples, and are not intended to limit the present disclosure. Among the constituent elements in the following embodiments and modification examples thereof, constituent elements not described in independent claims are described as arbitrary constituent elements. Also, a size or a ratio of sizes of a constituent element illustrated in the drawings is not necessarily exact.

Embodiment 1

1.1 Circuit Configuration of Directional Coupler

FIG. 1 is a circuit diagram illustrating an example of a functional configuration of a directional coupler 1 according to Embodiment 1. As illustrated in the figure, the directional coupler 1 includes a main line 11, a sub line 12, a variable filter 10, a termination circuit 14, and switches 15A and 15B. The main line 11 and the sub line 12 are electromagnetically coupled to each other as indicated by an arrow M in FIG. 1.

One end and another end of the main line 11 are connected to an input port 110 (RFin) and an output port 120 (RFout), respectively.

One end portion (first end portion) 121 of the sub line 12 is connected to the switch 15B, and another end portion (second end portion) 122 is connected to the switch 15A.

The termination circuit 14 is connected to the switches 15A and 15B.

The switch 15A includes a common terminal 151 (first common terminal), a selection terminal 152 (first selection terminal), and a selection terminal 153 (second selection terminal), and is a first switch circuit disposed between the other end portion 122 and the variable filter 10. The switch 15B includes a common terminal 154 (second common terminal), a selection terminal 155 (third selection terminal), and a selection terminal 156 (fourth selection terminal), and is a second switch circuit disposed between the one end portion 121 and the termination circuit 14. More specifically, the other end portion 122 is connected to the common terminal 151, the one end portion 121 is connected to the common terminal 154, an input terminal 101 of the variable filter 10 is connected to the selection terminals 152 and 155, and the termination circuit 14 is connected to the selection terminals 153 and 156.

That is, the termination circuit 14 is connected to the other end portion 122 with the switch 15A interposed therebetween, and is connected to the one end portion 121 with the switch 15B interposed therebetween. Further, the variable filter 10 is connected to the other end portion 122 with the switch 15A interposed therebetween, and is connected to the one end portion 121 with the switch 15B interposed therebetween.

Note that, in FIG. 1, although only one termination circuit, that is the termination circuit 14, is illustrated, a termination circuit may include a plurality of termination circuits connected to each of the switch 15A and the switch 15B.

According to the above configuration, in order to detect a high frequency signal transmitted in the main line 11 from the input port 110 to the output port 120 in the sub line 12, the common terminal 154 and the selection terminal 156 are made conductive, the common terminal 154 and the selection terminal 155 are made non-conductive, the common terminal 151 and the selection terminal 152 are made conductive, and the common terminal 151 and the selection terminal 153 are made non-conductive. On the other hand, in order to detect a high frequency signal transmitted in the main line 11 from the output port 120 to the input port 110 in the sub line 12, the common terminal 151 and the selection terminal 153 are made conductive, the common terminal 151 and the selection terminal 152 are made non-conductive, the common terminal 154 and the selection terminal 155 are made conductive, and the common terminal 154 and the selection terminal 156 are made non-conductive. That is, high frequency signals transmitted in both directions in the main line 11 can be detected with high accuracy in the sub line 12 by switching the selection terminals in the switches 15A and 15B.

Note that, the switches 15A and 15B need not be provided. In this case, in the directional coupler according to embodiments of the present disclosure has a configuration in which, when the high frequency signal transmitted in the main line 11 from the input port 110 to the output port 120 is detected in the sub line 12, the other end portion 122 is connected to the variable filter 10 without necessarily a switch interposed therebetween, and the one end portion 121 is connected to the termination circuit 14 without necessarily a switch interposed therebetween. Further, a configuration is included in which, when the high frequency signal transmitted in the main line 11 from the output port 120 to the input port 110 is detected in the sub line 12, the other end portion 122 is connected to the termination circuit 14 without necessarily a switch interposed therebetween, and the one end portion 121 is connected to the variable filter 10 without necessarily a switch interposed therebetween.

The variable filter 10 is a filter unit circuit with one continuous frequency band being a pass band or a stop band, and a variable passive element for shifting frequencies in the pass band is disposed in the filter unit circuit. Note that, the variable passive element is a passive element in which a circuit constant value of the element varies, and for example, corresponds to a variable inductor having a variable inductance value, and a variable capacitor having a variable capacitance value.

In the present embodiment, the above variable passive element includes a switch and a passive element connected to the switch.

Note that, the filter unit circuit is a filter circuit as described above, with one continuous frequency band being a pass band or a stop band, and does not correspond to a filter circuit below. That is, a filter circuit including a first circuit with one frequency band being a pass band or a stop band, a second circuit configured with a circuit element different from a circuit element configuring the first circuit, with another frequency band being a pass band or a stop band, and a switch circuit that switches the states (conductive state and non-conductive state) of each of the first circuit and the second circuit, does not correspond to the filter unit circuit. Note that, in this case, each of the first circuit and the second circuit described above corresponds to a filter unit circuit.

Accordingly, it is possible to shift the pass band or the stop band of the variable filter 10 by using the variable passive element provided in the filter unit circuit. In other words, one continuous frequency band defined as the pass band or the stop band of the variable filter can be changed depending on a desired frequency. Thus, a high frequency signal in a desired frequency band among high frequency signals transmitted in the main line 11 can be detected with high accuracy at an output terminal 100 with the one end portion 121 or the other end portion 122 of the sub line 12 to the variable filter 10 interposed therebetween, while other frequency components are removed.

In a mobile communication device such as a mobile phone in which a directional coupler is used, in recent years, frequency bands required for supporting multiband and globalization rapidly increase, while a power amplifier and a duplexer mounted in a mobile communication device have been becoming complicated and increased in size. For this reason, there is a strong demand for miniaturizing a directional coupler. Thus, it is necessary to miniaturize a filter incorporated in a directional coupler as much as possible.

In addition, in order to support multiband and globalization, when a filter circuit in which a plurality of filters (filter unit circuits), each having one fixed pass band or stop band, is disposed on a side of the sub line of the directional coupler as in the directional coupler in the related art, mutual interference among the filters (filter unit circuits) occurs. As a result, in a function required for the filters (filter unit circuits), ripples in a desired pass band and/or unnecessary spurious responses in a desired stop band occur. The above mutual interference between the filters increases and becomes complicated as the number of the filters (filter unit circuits) increases.

Examples of the mutual interference between filters (filter unit circuits) include (1) when a switch for switching the filters (filter unit circuits) is used, interference due to an isolation limit of the switch, (2) interference due to inductive coupling in a filter having an inductor, (3) interference due to vibration propagation in piezoelectric filters such as a Surface Acoustic Wave (SAW) filter and a Bulk Acoustic Wave (BAW) filter, and interference due to electric field coupling in a filter using a dielectric resonator and each of the above filters.

In order to suppress the mutual interference described above, it is conceivable to take measures such as enhancement of electromagnetic shielding and isolation, and division of a piezoelectric substrate and an acoustic wave resonator, but negative effects such as complication and increase in size are caused.

Compared to this, according to a configuration of the directional coupler 1 according to the present embodiment, since frequencies in the pass band or the stop band of the variable filter 10 that is the filter unit circuit are shifted by the variable passive element disposed in the filter unit circuit, it is not necessary to dispose a plurality of filters, each having a pass band corresponding to a frequency band to be detected. Thus, it is possible to provide the directional coupler 1, whereas miniaturized, that detects a high frequency signal in a desired frequency band with high accuracy.

Note that, in the directional coupler 1 according to the present embodiment, a filter other than the variable filter 10 is not connected to the one end portion 121 and the other end portion 122 of the sub line 12. In other words, other than the variable filter 10, any filter having a pass band corresponding to a frequency band to be detected is not disposed. Thus, the directional coupler 1 can be miniaturized, and ripples in the pass band and spurious waves in the stop band generated due to mutual interference among the filters when a plurality of filters is disposed can be suppressed, thereby improving detection accuracy.

Note that, the directional coupler according to embodiments of the present disclosure, similar to the directional coupler 1 according to the present embodiment, is not limited to a configuration that includes only the variable filter 10 as a filter connected to the sub line 12. For example, as in a directional coupler 3 according to Embodiment 3 described later, a configuration may be adopted in which a plurality of filters including the variable filter 10 is connected to the sub line 12.

1.2 Circuit Configuration and Transmission Characteristic of Variable Filter

Figure 2A:
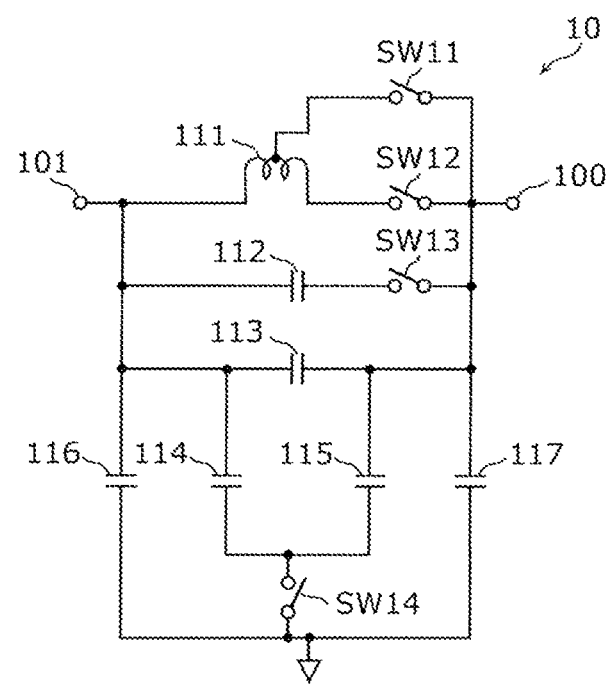
FIG. 2A is a circuit configuration diagram illustrating a first example (variable low pass filter) of a variable filter according to Embodiment 1.

FIG. 2A is a circuit configuration diagram illustrating the variable filter 10 (first example of the variable filter: a variable low pass filter) according to Embodiment 1. As illustrated in the figure, the variable filter 10 includes the input terminal 101, the output terminal 100, an inductor 111, capacitors 112, 113, 114, 115, 116, and 117, and switches SW11, SW12, SW13, and SW14. The variable filter 10 is configured with an inductor and capacitors that are passive elements of a lumped constant type.

A series arm circuit having the inductor 111, the switches SW11, SW12, and SW13, the capacitors 112 and 113 is connected between the input terminal 101 and the output terminal 100. Additionally, a parallel arm circuit having the capacitors 114, 115, 116, and 117, and the switch SW14 is connected between a path connecting the input terminal 101 and the output terminal 100, and a ground.

With the above connection configuration, the variable filter 10 has an inductance component in the series arm connecting the input terminal 101 and the output terminal 100, and has a capacitance component in the parallel arm connecting the series arm and the ground, thereby configuring a filter unit circuit (low pass filter) with one continuous frequency band being a pass band or a stop band. Here, an inductance value of the inductor 111 can be varied by switching the states (conductive state and non-conductive state) of each of the switches SW11 and SW12. Also, a composite capacitance value of the capacitors 112 and 113 can be varied by switching the states of the switch SW13. Further, a composite capacitance value of the capacitors 114 to 117 can be varied by switching the states of the switch SW14. In other words, the switches SW11 to SW14 for shifting frequencies in the pass band or the stop band are disposed inside the variable filter 10. Further, by switching the inductor and the capacitors by the plurality of switches SW11 to SW14, it is possible to generate each of the inductance value and the capacitance value that can be varied in a wide range.

According to the configuration of the variable filter 10, since the frequencies in the pass band or the stop band are shifted by the switches SW11 to SW14 disposed in the filter unit circuit, there is no need to dispose a plurality of filters, each having a pass band corresponding to a frequency band to be detected, and it is possible to provide the directional coupler 1, whereas miniaturized, that detects a high frequency signal in the desired frequency band with high accuracy.

Figure 3A:
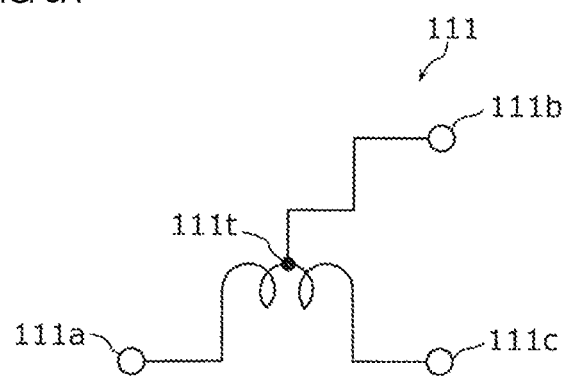
FIGS. 3A and 3B are diagrams illustrating a circuit configuration and planar structure of an inductor included in the variable filter according to Embodiment 1, respectively.
Figure 3B:
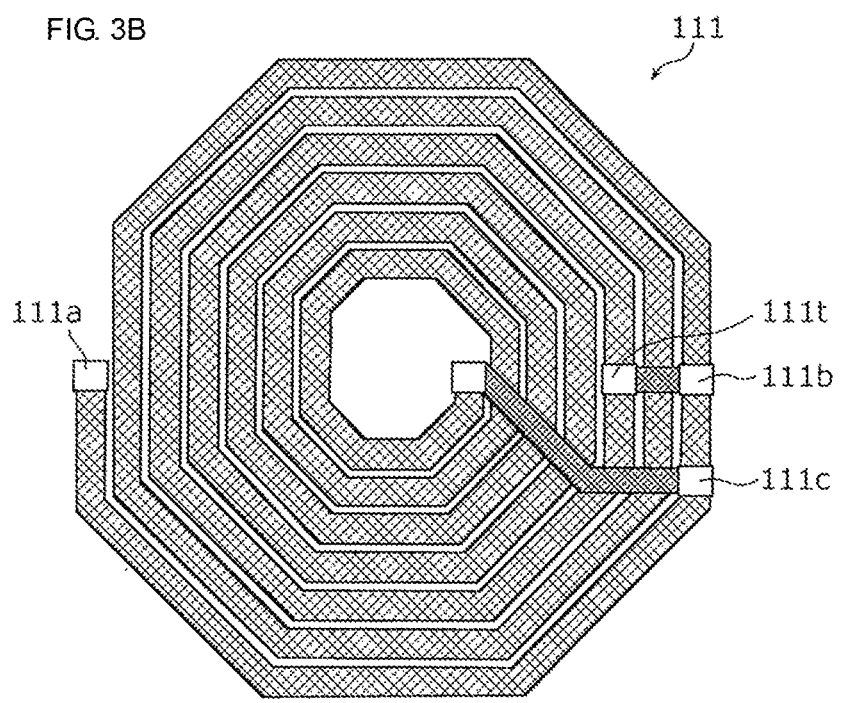

FIGS. 3A and 3B are diagrams illustrating a circuit configuration and planar structure of the inductor 111 included in the variable filter 10 according to Embodiment 1, respectively. FIG. 3A illustrates a circuit configuration diagram of the inductor 111, and FIG. 3B illustrates a plan configuration diagram of the inductor 111.

As illustrated in FIG. 3A, the inductor 111 has a terminal 111a (third terminal), a terminal 111b (first terminal), and a terminal 111c (second terminal), and has a first inductance value between the terminal 111b and the terminal 111a, and has a second inductance value different from the first inductance value between the terminal 111c and the terminal 111a. In order to have the different first inductance value and second inductance value described above, the inductor 111 is configured as a substantially spiral-shaped inductor configured by a planar coil pattern, as illustrated in FIG. 3B, for example. In substantially spiral-shaped wiring formed in an identical plane, the terminal 111a is connected to an outer peripheral end portion, the terminal 111c is connected to a leader line from an inner peripheral end portion, and the terminal 111b is connected to a leader line from a wiring node 11lt between the outer peripheral end portion and the inner peripheral end portion.

The substantially spiral-shaped inductor 111 configured by the planar coil pattern can suppress distribution of magnetic flux to be smaller, and confine the magnetic flux within a short distance from a center of the inductor 111, compared to a substantially solenoid-shaped inductor. Moreover, since two different inductance values are generated by the single substantially spiral-shaped inductor ill, the magnetic flux can be confined in a further smaller region, compared to a configuration in which two substantially spiral-shaped inductors are disposed. Thus, unnecessary inductive coupling between the inductor 111 and each of the main line 11 and the sub line 12 can be suppressed, so that characteristic deterioration in the directional coupler 1 can be suppressed. Further, since the distance and the region in which the magnetic flux is confined are small, a distance between the inductor 111 and each of the main line 11 and the sub line 12 can be reduced, so that the directional coupler 1 can be miniaturized.

Further, as illustrated in FIG. 2A and FIGS. 3A and 3B, the terminal 111*b* is connected to the switch SW11, and the terminal 111*c* is connected to the switch SW12. By making the switch SW11 conductive and the switch SW12 non-conductive, the inductor 111 has the first inductance value, and by making the switch SW11 non-conductive and the switch SW12 conductive, the inductor 111 has the second inductance value. That is, by switching the states of each of the switches SW11 and SW12, a plurality of the inductance values can be selectively provided by the single inductor 111, so that the variable filter 10 can be miniaturized.

Note that, the inductor 111 configuring the variable filter 10 need not be the substantially spiral-shaped inductor configured with only one layer of the planar coil pattern, and may be configured with a plurality of layers of planar coil patterns. Further, each of the plurality of planar coil patterns need not be substantially spiral-shaped, and may be a single-turn coil pattern.

Additionally, the inductor 111 is not limited to an inductor having only three terminals, but may be an inductor having three or more terminals, such as four terminals and five terminals.

Furthermore, the inductor 111 configuring the variable filter 10 need not be configured with one inductor, and a configuration may be adopted in which two independent inductors having different inductance values are connected to the switches SW11 and SW12 respectively.

Further, the inductor 111 may be Micro Electro Mechanical Systems (MEMS) type inductance having a mechanism for continuously varying an inductance value by continuously varying a magnetic path or the like, or may be a chip component. By using MEMS type inductance in which an inductance value continuously varies, electric characteristics of a filter can be continuously varied, so that precise adjustment can be achieved.

In addition, examples of the switches SW11 to SW14 include, for example, a Field Effect Transistor (FET) switch made of GaAs or Complementary Metal Oxide Semiconductor (CMOS), or a diode switch.

Further, each of the capacitors 112 to 117 may be a capacitor having Metal Insulator Metal (MIM) structure or may be a capacitor formed by opposing comb-shaped electrodes, or may be a chip component. Further, an MEMS type capacitor having a mechanism for continuously varying an overlapping area of opposing electrodes may be used. By using an MEMS type inductor in which an inductance value is continuously varied, and an MEMS type capacitor in which a capacitance value is continuously varied, electric characteristics of a filter are continuously varied, and a pass band and a stop band can be precisely adjusted. Further, by using a capacitor having MIM structure, a relatively large capacitance value can be realized even when the capacitor is small, and leakage of an electric field can be suppressed, so that unnecessary capacitive coupling with each of the main line 11 and the sub line 12 can be suppressed. Further, by using a capacitor formed by comb-shaped electrodes, a manufacturing process can be simplified. Further, by using a chip component, large capacitance and a high Q value can be realized.

Figure 2B:
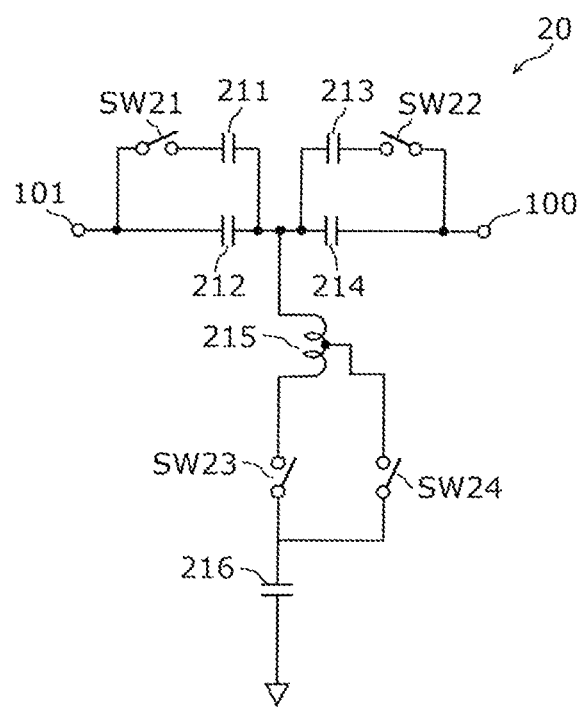
FIG. 2B is a circuit configuration diagram illustrating a second example (variable high pass filter) of the variable filter according to Embodiment 1.

Note that, the variable filter 10 included in the directional coupler 1 may be a variable filter 20 illustrated in FIG. 2B.

FIG. 2B is a circuit configuration diagram illustrating the variable filter 20 (second example of the variable filter: a variable high pass filter) according to Embodiment 1. As illustrated in the figure, the variable filter 20 includes the input terminal 101, the output terminal 100, an inductor 215, capacitors 211, 212, 213, 214 and 216, and switches SW21, SW22, SW23 and SW24. The variable filter 20 is configured with an inductor and capacitors of a lumped constant type.

A first series arm circuit having the capacitors 211 and 212 and the switch SW21, and a second series arm circuit having the capacitors 213 and 214 and the switch SW22 are connected in series between the input terminal 101 and the output terminal 100. Further, a parallel arm circuit having the inductor 215, the capacitor 216, the switches SW23 and SW24 is connected between a connection point of the first series arm circuit and the second series arm circuit, and the ground.

With the above connection configuration, the variable filter 20 has a capacitor component in the series arm connecting the input terminal 101 and the output terminal 100, and has a inductance component in the parallel arm connecting the series arm and the ground, thereby configuring a filter unit circuit (high pass filter) with one continuous frequency band being a pass band or a stop band. Here, an inductance value of the inductor 215 can be varied by switching the states of each of the switches SW23 and SW24. Also, a composite capacitance value of capacitors 211 and 212 can be varied by switching the states of the switch SW21. Also, a composite capacitance value of the capacitors 213 and 214 can be varied by switching the states of the switch SW22. In other words, the switches SW21 to SW24 for shifting frequencies in a pass band or a stop band are disposed inside the variable filter 20. Further, by switching the inductor and the capacitors by the plurality of switches SW21 to SW24, it is possible to generate an inductance value and a capacitance value that can be varied in respective wide ranges.

According to the configuration of the variable filter 20, since the frequencies in the pass band or the stop band are shifted by the switches SW21 to SW24 disposed in the filter unit circuit, there is no need to dispose a plurality of filters, each having a pass band corresponding to a frequency band to be detected, and it is possible to provide the directional coupler 1, whereas miniaturized, that detects a high frequency signal in the desired frequency band with high accuracy.

Note that, a configuration of the inductor 215 is similar to that of the inductor 111 of the variable filter 10. Thus, unnecessary inductive coupling between the inductor 215 and each of the main line 11 and the sub line 12 can be suppressed, so that characteristic deterioration in the directional coupler 1 can be suppressed. Additionally, by switching the states of each of the switches SW23 and SW24, a plurality of the inductance values can be selectively provided by the single inductor 215, so that the variable filter 20 can be miniaturized.

Figure 2C:
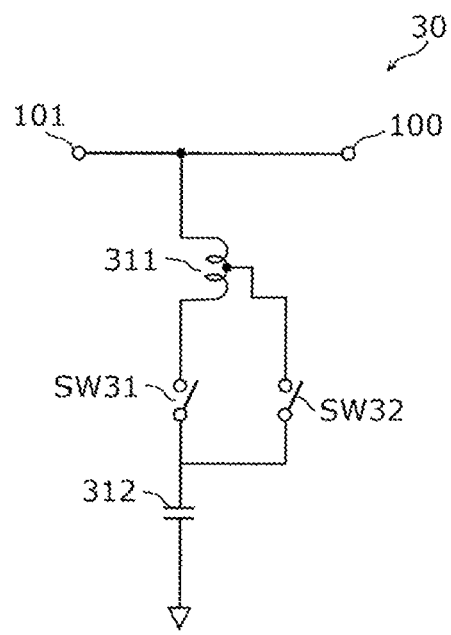
FIG. 2C is a circuit configuration diagram illustrating a third example (variable band elimination filter) of the variable filter according to Embodiment 1.

Note that, the variable filter 10 included in the directional coupler 1 may be a variable filter 30 illustrated in FIG. 2C.

FIG. 2C is a circuit configuration diagram illustrating the variable filter 30 (third example of the variable filter: variable band elimination filter) according to Embodiment 1. As illustrated in the figure, the variable filter 30 includes the input terminal 101, the output terminal 100, an inductor 311, a capacitor 312, switches SW31 and SW32. The variable filter 30 is configured with an inductor and a capacitor of a lumped constant type.

A parallel arm circuit having the inductor 311, the capacitor 312, and the switches SW31 and SW32 is connected between the series arm connecting the input terminal 101 and the output terminal 100, and the ground.

In the above connection configuration, the variable filter 30 includes an LC series resonance circuit in a parallel arm connecting the series arm and the ground, thus the variable filter 30 is a filter unit circuit with one continuous frequency band being a stop band, thereby configuring a band elimination filter. Here, an inductance value of the inductor 311 can be varied by switching the states of each of the switches SW31 and SW32. In other words, the switches SW31 to SW32 for shifting frequencies in the stop band are disposed inside the variable filter 30.

According to the configuration of the variable filter 30, since the frequencies in the stop band are shifted by the switches SW31 and SW32 disposed in the filter unit circuit, there is no need to dispose a plurality of filters, each having a pass band corresponding to a frequency band to be detected, and it is possible to provide the directional coupler 1, whereas miniaturized, that detects a high frequency signal in the desired frequency band with high accuracy.

Note that, a configuration of the inductor 311 is similar to that of the inductor 111 of the variable filter 10. Thus, unnecessary inductive coupling between the inductor 311 and each of the main line 11 and the sub line 12 can be suppressed, so that characteristic deterioration in the directional coupler 1 can be suppressed. Further, by switching the states of each of the switches SW31 and SW32, a plurality of the inductance values can be selectively provided by the single inductor 311, so that the variable filter 30 can be miniaturized.

Figure 2D:
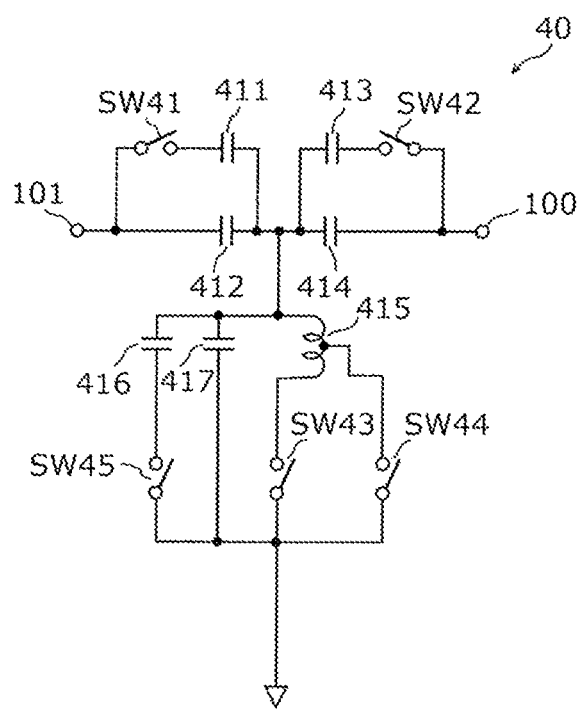
FIG. 2D is a circuit configuration diagram illustrating a fourth example (variable band pass filter) of the variable filter according to Embodiment 1.

Note that, the variable filter 10 included in the directional coupler 1 may be a variable filter 40 illustrated in FIG. 2D.

FIG. 2D is a circuit configuration diagram illustrating the variable filter 40 (fourth example of the variable filter: variable band pass filter) according to Embodiment 1. As illustrated in the figure, the variable filter 40 includes the input terminal 101, the output terminal 100, an inductor 415, capacitors 411, 412, 413, 414, 416, and 417, and switches SW41, SW42, SW43, SW44, and SW45. The variable filter 40 is configured with an inductor and capacitors of a lumped constant type.

A first series arm circuit having the capacitors 411 and 412 and the switch SW41, and a second series arm circuit having the capacitors 413 and 414 and the switch SW42 are connected in series between the input terminal 101 and the output terminal 100. Further, a parallel arm circuit having the inductor 415, the capacitors 416 and 417, the switches SW43, SW44, and SW45 is connected between a connection point of the first series arm circuit and the second series arm circuit, and the ground.

With the above connection configuration, the variable filter 40 has a capacitor component in the series arm connecting the input terminal 101 and the output terminal 100, and has an LC parallel resonant circuit in the parallel arm connecting the series arm and the ground, thereby configuring a filter unit circuit (band pass filter) with one continuous frequency band being a pass band or a stop band. Here, an inductance value of the inductor 415 can be varied by switching the states of each of the switches SW43 and SW44. Also, a composite capacitance value of the capacitors 411 and 412 can be varied by switching the states of the switch SW41. Also, a composite capacitance value of the capacitors 413 and 414 can be varied by switching the states of the switch SW42. Also, a composite capacitance value of the capacitors 416 and 417 can be varied by switching the states of the switch SW45. In other words, the switches SW41 to SW45 for shifting frequencies in the pass band or the stop band are disposed inside the variable filter 40.

According to the configuration of the variable filter 40, since the frequencies in the pass band or the stop band are shifted by the switches SW41 to SW45 disposed in the filter unit circuit, there is no need to dispose a plurality of filters, each having a pass band corresponding to a frequency band to be detected, and it is possible to provide the directional coupler 1, whereas miniaturized, that detects a high frequency signal in the desired frequency band with high accuracy.

Note that, a configuration of the inductor 415 is similar to that of the inductor 111 of the variable filter 10. Thus, unnecessary inductive coupling between the inductor 415 and each of the main line 11 and the sub line 12 can be suppressed, so that characteristic deterioration in the directional coupler 1 can be suppressed. Further, by switching the states of each of the switches SW43 and SW44, a plurality of the inductance values can be selectively provided by the single inductor 415, so that the variable filter 40 can be miniaturized.

Figure 4A:
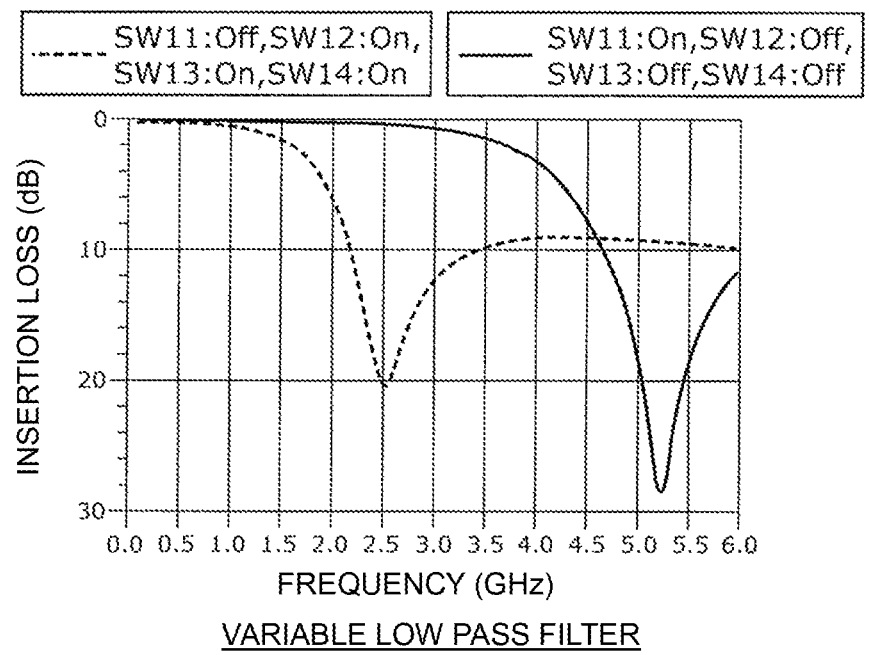
FIG. 4A is a graph illustrating a transmission characteristic in the first example of the variable filter according to Embodiment 1.

FIG. 4A is a graph illustrating a transmission characteristic in the variable filter 10 (first example) according to Embodiment 1. As illustrated in the figure, in the variable filter 10, for example, by making the switch SW11 non-conductive, and the switches SW12, SW13, and SW 14 conductive, a band on a frequency side lower than about 1.5 GHz becomes a pass band, and a band on a frequency side higher than about 1.5 GHz becomes a stop band. Further, for example, by making the switch SW11 conductive, and the switches SW12, SW13, and SW14 non-conductive, a band on a frequency side lower than about 3.5 GHz becomes a pass band, and a band on a frequency side higher than about 3.5 GHz becomes a stop band.

According to the above transmission characteristic of the variable filter 10, for example, when a high frequency signal in a desired frequency band (about 1.5 GHz or less, or about 3.5 GHz or less) is detected, a high frequency signal obtained by removing a harmonic wave or the like from the high frequency signal can be detected with high accuracy.

Figure 4B:
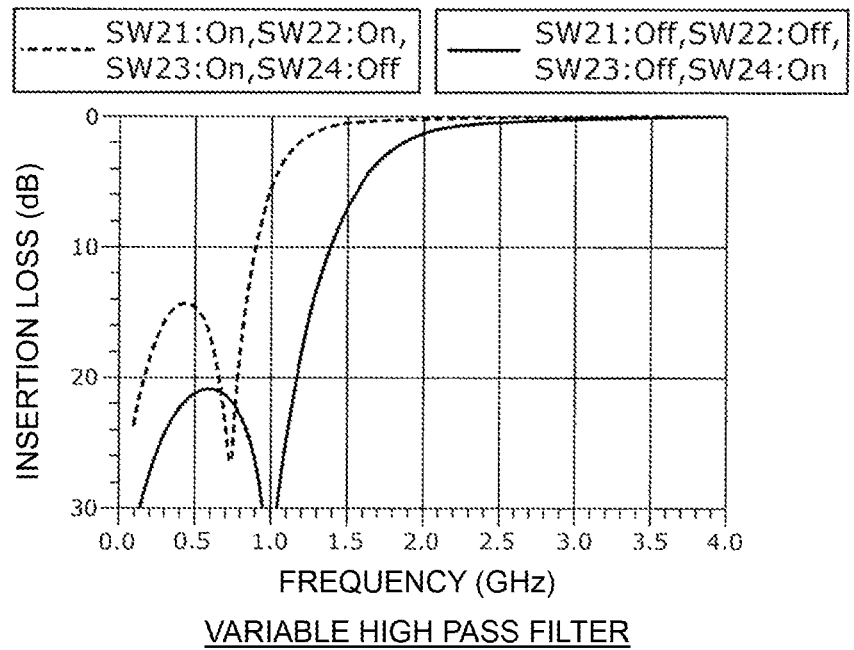
FIG. 4B is a graph illustrating a transmission characteristic in the second example of the variable filter according to Embodiment 1.

FIG. 4B is a graph illustrating transmission characteristics in the variable filter 20 (second example) according to Embodiment 1. As illustrated in the figure, in the variable filter 20, for example, by making the switches SW21, SW22, and SW23 conductive, and the switch SW24 non-conductive, a frequency band higher than about 1.5 GHz becomes a pass band, and a frequency band lower than about 1.5 GHz becomes a stop band. Further, for example, by making the switches SW21, SW22 and SW23 non-conductive and the switch SW24 conductive, a frequency band higher than about 2.0 GHz becomes a pass band, and a frequency band lower than about 2.0 GHz becomes a stop band.

According to the above transmission characteristic of the variable filter 20, for example, when a high frequency signal in a desired frequency band (about 1.5 GHz or more, or about 2.0 GHz or more) is detected, a high frequency signal obtained by removing a spurious wave or the like appearing on a frequency side lower than the high frequency signal can be detected with high accuracy.

Figure 5A:
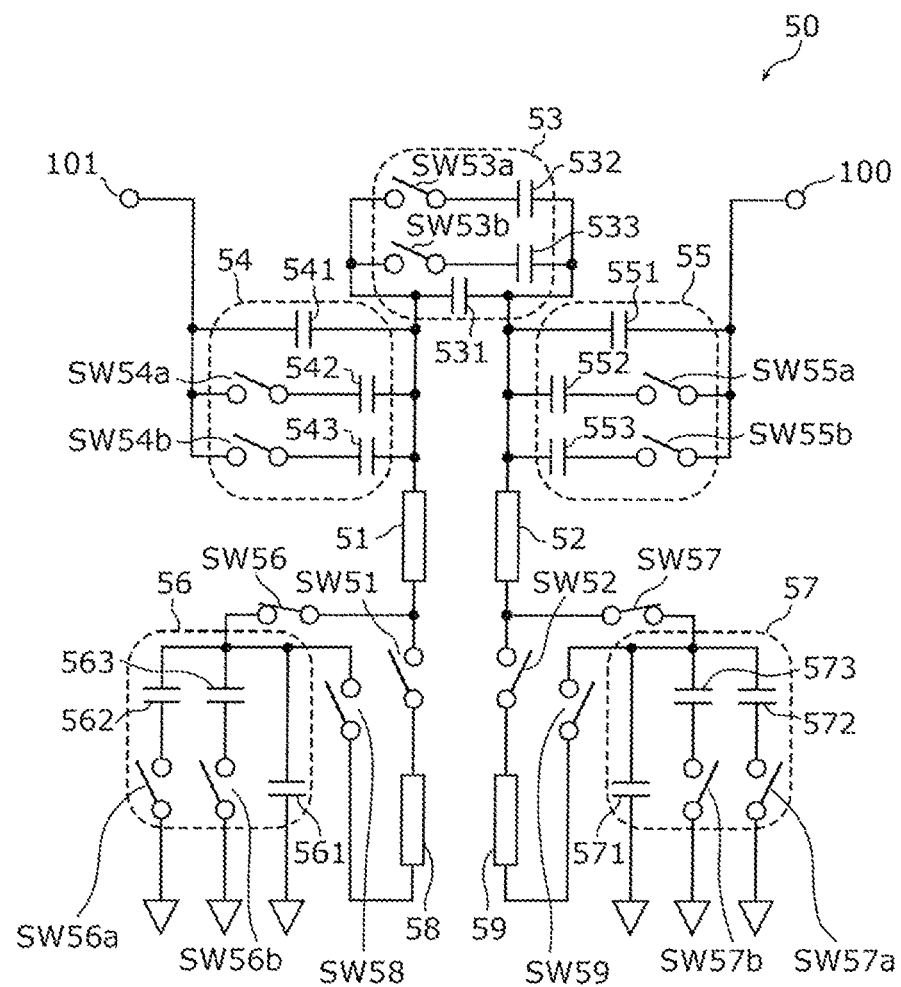
FIG. 5A is a circuit configuration diagram illustrating a fifth example (variable band pass filter) of the variable filter according to Embodiment 1.

Note that, the variable filter 10 included in the directional coupler 1 may be a variable filter 50 illustrated in FIG. 5A.

FIG. 5A is a circuit configuration diagram illustrating the variable filter 50 (fifth example of the variable filter: variable band pass filter) according to Embodiment 1. As illustrated in the figure, the variable filter 50 includes the input terminal 101, the output terminal 100, for example, lines 51, 52, 58, and 59 of a distributed constant type, each configured with a microstrip line or the like, a band width adjustment circuit 53, impedance matching circuits 54 and 55, center frequency adjustment circuits 56 and 57, and switches SW51, SW52, SW56, SW57, SW 58, and SW59. The variable filter 50 is configured with the band width adjustment circuit 53, the impedance matching circuits 54 and 55, the center frequency adjustment circuits 56 and 57 of a lumped constant type, and the lines (passive elements) 51, 52, 58, and 59 of a distributed constant type.

By the lines 51 and 52, for example, a Transverse Electro Magnetic (TEM) mode resonator (main resonator) is formed. A length in a longitudinal direction of each of the lines 51 and 52 is shorter by a predetermined length than about half a wave length of a frequency that is higher by a predetermined frequency than a center frequency of a first frequency band.

The lines 58 and 59 of a distributed constant type form, for example, a TEM mode resonator (resonator for adjustment). The line 58 is connected to the line 51 with the switch SW51 interposed therebetween, and the line 59 is connected to the line 52 with the switch SW52 interposed therebetween, so that a resonator corresponding to a frequency band different from that of the main resonator can be formed. A length in the longitudinal direction of each of a length of the lines 51 and 58 connected with the switch SW51 interposed therebetween (the sum of a length of the line 51 and a length of the line 58) and a length of the lines 52 and 59 connected with the switch SW52 interposed therebetween (the sum of a length of the line 52 and a length of the line 59) is shorter by a predetermined length than about half a wave length of a frequency that is higher by a predetermined frequency than a center frequency of a second frequency band different from the first frequency band.

The band width adjustment circuit 53 is a first circuit having capacitors 531, 532 and 533, switches SW53a and SW53b, and adjusts coupling between resonators 51 and 52 and coupling between resonators 58 and 59 to adjust a pass band width of the variable filter 50.

The impedance matching circuit 54 is a second circuit having capacitors 541, 542, and 543, and switches SW54a and SW54b, and adjusts impedance matching on a side of the input terminal 101. The impedance matching circuit 55 is a third circuit having capacitors 551, 552, and 553, switches SW55a and SW55b, and adjusts impedance matching on a side of the output terminal 100.

The center frequency adjustment circuit 56 is a fourth circuit having capacitors 561, 562, and 563, switches SW56a and SW56b, and adjusts a resonant frequency of a resonator configured to include at least two or more lines of the lines 51, 52, 58, and 59 of the distributed constant type to set a center frequency. The center frequency adjustment circuit 57 is a fifth circuit having capacitors 571, 572, and 573, switches SW57a and SW57b, and adjusts a resonant frequency of a resonator configured to include at least two or more lines of the lines 51, 52, 58, and 59 of the distributed constant type to set a center frequency.

The impedance matching circuit 54, the band width adjustment circuit 53, and the impedance matching circuit 55 are connected in series to a path connecting the input terminal 101 and the output terminal 100.

One end of the line 51 is connected to the band width adjustment circuit 53 and the impedance matching circuit 54, and another end of the line 51 is connected to one end of the line 58 with the switch SW51 interposed therebetween, and is connected to the center frequency adjustment circuit 56 with the switch SW56 interposed therebetween. Another end of the line 58 is connected to the center frequency adjustment circuit 56 with the switch SW58 interposed therebetween.

One end of the line 52 is connected to the band width adjustment circuit 53 and the impedance matching circuit 55, and another end of the resonator 52 is connected to one end of the line 59 with the switch SW52 interposed therebetween, and is connected to the center frequency adjustment circuit 57 with the switch SW57 interposed therebetween. Another end of the line 59 is connected to the center frequency adjustment circuit 57 with the switch SW59 interposed therebetween.

According to the above configuration of the variable filter 50, frequencies in the pass band or a stop band can be shifted by switching the states of each of the switches SW51 to SW52, SW56 to SW59, SW53a, SW53b, SW54a, SW54b, SW55a, SW55b, SW56a, SW56b, SW57a, and SW57b disposed in the filter unit circuit. Accordingly, there is no need to dispose a plurality of filters, each having a pass band corresponding to a frequency band to be detected, and it is possible to provide the directional coupler 1, whereas miniaturized, that detects a high frequency signal in a desired frequency band with high accuracy.

Figure 5B:
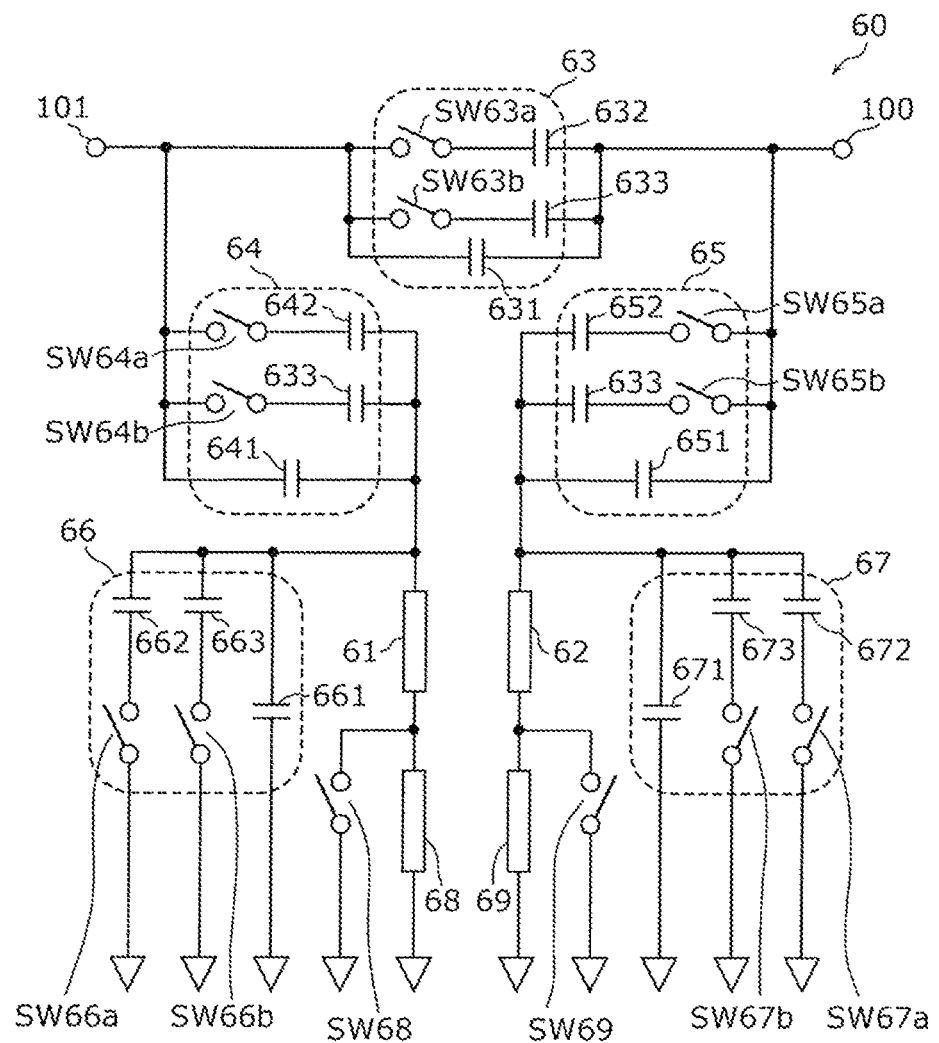
FIG. 5B is a circuit configuration diagram illustrating a sixth example (variable band pass filter) of the variable filter according to Embodiment 1.

FIG. 5B is a circuit configuration diagram illustrating a variable filter 60 (sixth example of the variable filter: variable band pass filter) according to Embodiment 1. As illustrated in the figure, the variable filter 60 includes the input terminal 101, the output terminal 100, resonators 61, 62, 68 and 69, a band width adjustment circuit 63, impedance matching circuits 64 and 65, center frequency adjustment circuits 66 and 67, and switches SW68 and SW69. The variable filter 60 is configured with the band width adjustment circuit 63, the impedance matching circuits 64 and 65, the center frequency adjustment circuits 66 and 67 of a lumped constant type, and lines 61, 62, 68, and 69 of a distributed constant type.

The lines 61 and 62 of the distributed constant type form, for example, a TEM mode resonator (main resonator). A length in a longitudinal direction of each of the lines 61 and 62 is shorter by a predetermined length than about one fourth a wave length of a frequency that is higher by a predetermined frequency than a center frequency of a first frequency band.

The lines 68 and 69 of the distributed constant type form, for example, a TEM mode resonator (resonator for adjustment). The line 68 is connected to the line 61 by opening the switch SW68, and the line 69 is connected to the line 62 by opening the switch SW69. Accordingly, a resonator corresponding to a frequency band different from that of the main resonator can be formed. A length in the longitudinal direction of each of a length of the lines 61 and 68 connected to each other (the sum of a length of the line 61 and a length of the line 68) and a length of the lines 62 and 69 connected to each other (the sum of a length of the line 62 and a length of the line 69) is shorter by a predetermined length than about one fourth a wave length of a frequency that is higher by a predetermined frequency than a center frequency of a second frequency band different from the first frequency band.

The band width adjustment circuit 63 is a first circuit having capacitors 631, 632 and 633, switches SW63a and SW63b, and adjusts coupling between the resonators 61 and 62 and coupling between the resonators 68 and 69 to adjust a pass band width of the variable filter 60.

The impedance matching circuit 64 is a second circuit having capacitors 641, 642, and 643, and switches SW64a and SW64b, and adjusts impedance matching on a side of the input terminal 101. The impedance matching circuit 65 is a third circuit having capacitors 651, 652, and 653, switches SW65a and SW65b, and adjusts impedance matching on a side of the output terminal 100.

The center frequency adjustment circuit 66 is a fourth circuit having capacitors 661, 662, and 663, switches SW66a and SW66b, and adjusts a resonant frequency of a resonator configured to include at least two or more lines of the lines 61, 62, 68, and 69 of the distributed constant type to set a center frequency. The center frequency adjustment circuit 67 is a fifth circuit having capacitors 671, 672, 673, switches SW67a and SW67b, and adjusts a resonant frequency of a resonator configured to include at least two or more lines of the lines 61, 62, 68, and 69 of the distributed constant type to set a center frequency.

The band width adjustment circuit 63 is connected in series to a path connecting the input terminal 101 and the output terminal 100. The impedance matching circuit 64 is connected to the input terminal 101, and the impedance matching circuit 65 is connected to the output terminal 100.

One end of the line 61 is connected to the impedance matching circuit 64 and the center frequency adjustment circuit 66, and another end of the line 61 is connected to one end of the line 68 and the switch SW68. One end of the line 62 is connected to the impedance matching circuit 65 and the center frequency adjustment circuit 67, and another end of the line 62 is connected to one end of the line 69 and the switch SW69. Another end of the line 68 and another end of the line 69 are connected to the ground.

According to the above configuration of the variable filter 60, frequencies in the pass band or a stop band can be shifted by switching the states of each of the switches SW68 to SW69, SW63a, SW63b, SW64a, SW64b, SW65a, SW65b, SW66a, SW66b, SW67a, and SW67b disposed in the filter unit circuit. Accordingly, there is no need to dispose a plurality of filters, each having a pass band corresponding to a frequency band to be detected, and it is possible to provide the directional coupler 1, whereas miniaturized, that detects a high frequency signal in a desired frequency band with high accuracy.

FIGS. 6A to 6C are mounting configuration diagrams of the directional coupler 1 including the variable filter 50 according to Embodiment 1. FIG. 6A illustrates a plan configuration view (viewed from a positive z axis direction) of the directional coupler 1, FIG. 6B illustrates a first side surface configuration view (viewed from a negative y axis direction) of the directional coupler 1, and FIG. 6C illustrates a second side surface configuration view (viewed from a positive x axis direction) of the directional coupler 1.

A dielectric substrate 510 using a material such as ceramics and a semiconductor substrate 520 are attached to a terminal substrate 530. The directional coupler 1 is mounted on or in the dielectric substrate 510 and the semiconductor substrate 520. As illustrated in FIG. 6A, the lines 51, 52, 58, and 59 of the distributed constant type are formed on or in the dielectric substrate 510. Further, the main line 11, the sub line 12, switches, a control unit, the band width adjustment circuit 53, the impedance matching circuits 54 and 55, and the center frequency adjustment circuits 56 and 57, and the like, are formed on or in the semiconductor substrate 520. Further, as illustrated in FIGS. 6B and 6C, each of the dielectric substrate 510 and the semiconductor substrate 520 is connected to the terminal substrate 530 by bump electrodes, for example. A resin member 540 is formed on a main surface of the terminal substrate 530 to which the dielectric substrate 510 and the semiconductor substrate 520 are attached, so as to cover the dielectric substrate 510 and the semiconductor substrate 520.

Since a substrate material with a low loss and a high dielectric constant is selected for the dielectric substrate 510, the resonators 51, 52, 58, and 59 can be miniaturized and reduced in loss, so that the variable filter 50 can be miniaturized and reduced in loss.

Further, by appropriately selecting a dielectric constant of the semiconductor substrate 520, respective electric lengths of the main line 11 and the sub line 12 can be optimized, and fine machining of the main line 11 and the sub line 12 can be performed with high accuracy. Thus, it is possible to suppress characteristic variation in the directional coupler 1.

On the other hand, since each passive element of a lumped constant type constituting the variable filter 50 is formed on or in the semiconductor substrate 520, a Q value tends to be relatively lower, and on-resistance of each switch formed on or in the semiconductor substrate 520 tends to rise, but the passive element and the switch can be connected to the sub line 12 instead of the main line 11, thereby making it possible to suppress influence of a low Q value and high on-resistance.

In a normal high frequency circuit, it is not preferable to dispose an inductor with a low Q value and a switch with high on-resistance on a transmission line, in order to ensure low loss property in the high frequency circuit. Compared to this, since the sub line 12 of the directional coupler 1 according to the present embodiment has a coupling ratio of, for example, about −20 to −30 dB with respect to the main line 11, a loss of several dB due to an inductor with a low Q value and a switch with a high on-resistance does not affect detection accuracy of a high frequency signal. Also from this point of view, the influence of the low Q value and the high on-resistance can be canceled by connecting the passive element and the switch to the sub line 12.

Note that, the lines 51, 52, 58, and 59 of the distributed constant type may be formed on the semiconductor substrate 520 instead of the dielectric substrate 510. In this case, a silicon substrate having a relatively high resistance as the semiconductor substrate 520 can be used, and by adopting Silicon On Insulator (SOI) structure provided with an insulator layer, it is possible to increase a Q value of each line, thereby reducing the variable filter 50 in loss. Further, connection with each switch and capacitor formed on or in the semiconductor substrate 520 is facilitated, thereby improving reliability.

Further, the lines 51, 52, 58, and 59 of the distributed constant type may be directly formed on or in the terminal substrate 530 instead of the dielectric substrate 510. In this case, a resin substrate or a dielectric ceramic substrate having a relatively low loss as the terminal substrate 530 can be used. In this case, by reducing a dielectric constant of the terminal substrate 530, a conductor loss of the line of the distributed constant type can be reduced without necessarily excessively reducing impedance of a resonator, so that the variable filter 50 can be reduced in loss. Further, by increasing the dielectric constant of the terminal substrate 530, the line of the distributed constant type can be miniaturized, so that the variable filter 50 can be miniaturized.

Figure 7A:
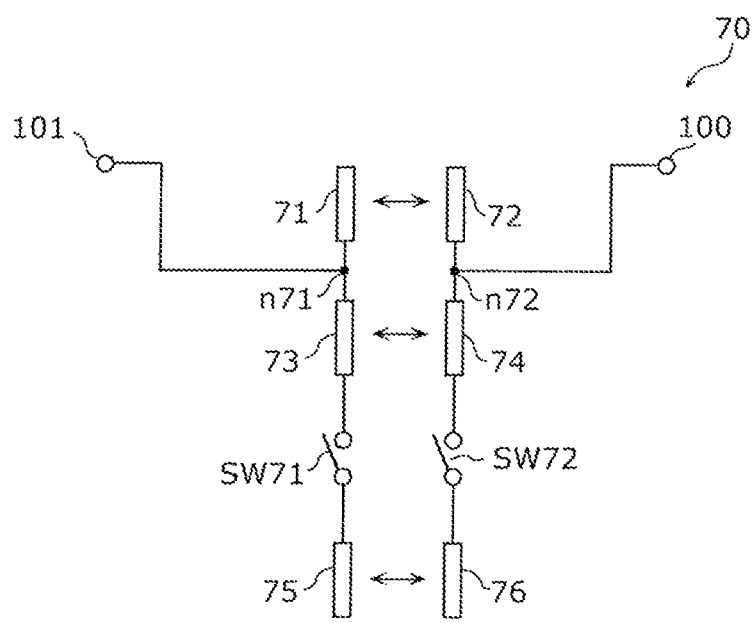
FIG. 7A is a circuit configuration diagram illustrating a seventh example (variable band pass filter) of the variable filter according to Embodiment 1.

FIG. 7A is a circuit configuration diagram illustrating a variable filter 70 (seventh example of the variable filter: variable band pass filter) according to Embodiment 1. As illustrated in the figure, the variable filter 70 includes the input terminal 101, the output terminal 100, lines (for example, strip lines) 71, 72, 73, 74, 75 and 76 of a distributed constant type, and switches SW71 and SW72. The variable filter 70 is formed of the lines 71 to 76 of the distributed constant type.

Each of the lines 71, 72, 75, and 76, for example, is a strip line in which one end is in an open state and that functions as an open stub. One end of the line 73 is connected to another end of the line 71, and another end of the line 73 is connected to another end of the line 75 with the switch SW71 interposed therebetween. One end of the line 74 is connected to another end of the line 72, and another end of the line 74 is connected to another end of the line 76 with the switch SW72 interposed therebetween.

The input terminal 101 is connected to a connection node n71 between the lines 71 and 73, and the output terminal 100 is connected to a connection node n72 between the lines 72 and 74.

The lines 71 and 72 are electromagnetically coupled to each other, the lines 73 and 74 are electromagnetically coupled to each other, and the lines 75 and 76 are electromagnetically coupled to each other.

The sum of an electric length of the line 71 and an electric length of the line 73, and the sum of an electric length of the line 72 and an electric length of the line 74 are about half a wave length of a center frequency of a second frequency band. Further, the sum of the electric length of the line 71, the electric length of the line 73 and an electric length of the line 75, and the sum of the electric length of the line 72, the electric length of the line 74 and an electric length of the line 76, are about half a wave length of a center frequency of a first frequency band f1 that is a frequency band lower than the second frequency band f2, for example.

In the above configuration of the variable filter 70, for example, by making the switches SW71 and SW72 conductive, the first frequency band f1 becomes a pass band. Further, for example, by making the switches SW71 and SW72 non-conductive, the second frequency band f2 becomes a pass band. According to the above transmission characteristic of the variable filter 70, when a high frequency signal in the first frequency band f1 or the second frequency band f2 is detected, a high frequency signal obtained by removing a harmonic wave and a spurious wave from the high frequency signal can be detected with high accuracy.

Figure 7B:
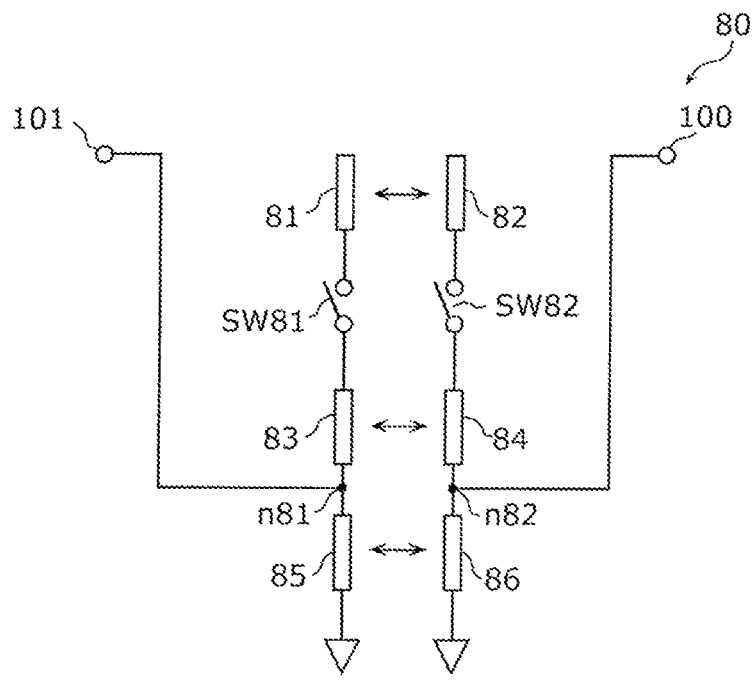
FIG. 7B is a circuit configuration diagram illustrating an eighth example (variable band pass filter) of the variable filter according to Embodiment 1.

FIG. 7B is a circuit configuration diagram illustrating a variable filter 80 according to Embodiment 1 (eighth example of the variable filter: a variable band pass filter). As illustrated in the figure, the variable filter 80 includes the input terminal 101, the output terminal 100, lines (for example, strip lines) 81, 82, 83, 84, 85 and 86 of a distributed constant type, and switches SW81 and SW82. The variable filter 80 is formed of the lines 81 to 86 of the distributed constant type.

Each of the lines 81 and 82, for example, is a strip line in which one end is in an open state and that functions as an open stub. One end of the line 83 is connected to another end of the line 81 with the switch SW81 interposed therebetween, and another end of the line 83 is connected to one end of the line 85. One end of the line 84 is connected to another end of the line 82 with the switch SW82 interposed therebetween, and another end of the line 84 is connected to one end of the line 86. Another end of the line 85 and another end of the line 86 are connected to the ground.

The input terminal 101 is connected to a connection node n81 between the lines 83 and 85, and the output terminal 100 is connected to a connection node n82 between the lines 84 and 86.

The lines 81 and 82 are electromagnetically coupled to each other, the lines 83 and 84 are electromagnetically coupled to each other, and the lines 85 and 86 are electromagnetically coupled to each other.

The sum of an electric length of the line 83 and an electric length of the line 85, and the sum of an electric length of the line 84 and an electric length of the line 86 are about one fourth a wave length of a center frequency of a second frequency band f2. Further, the sum of the electric length of the line 81 and the electric length of the line 83 and an electric length of the line 85, and the sum of the electric length of the line 82 and the electric length of the line 84 and an electric length of the line 86, are about one fourth a wave length of a center frequency of a first frequency band f1 that is a frequency band lower than the second frequency band, for example.

In the above configuration of the variable filter 80, for example, by making the switches SW81 and SW82 conductive, the first frequency band f1 becomes a pass band. Further, for example, by making the switches SW81 and SW82 non-conductive, the second frequency band f2 becomes a pass band. According to the above transmission characteristic of the variable filter 80, when a high frequency signal in the first frequency band f1 or the second frequency band f2 is detected, a high frequency signal obtained by removing a harmonic wave and a spurious wave from the high frequency signal can be detected with high accuracy.

FIGS. 8A to 8C are mounting configuration diagrams of the directional coupler 1 including the variable filter 70 according to Embodiment 1. FIG. 8A illustrates a plan configuration view (viewed from the positive z axis direction) of the directional coupler 1, FIG. 8B illustrates a first side surface configuration view (viewed from the negative y axis direction) of the directional coupler 1, and FIG. 8C illustrates a second side surface configuration view (viewed from the positive x axis direction) of the directional coupler 1.

A dielectric substrate 710 made of a material such as ceramics, and a semiconductor substrate 720 are attached to a terminal substrate 730. The directional coupler 1 is mounted on or in the dielectric substrate 710 and the semiconductor substrate 720. As illustrated in FIG. 8A, the lines 71, 72, 73, 74, 75, and 76 of the distributed constant type are formed on or in the dielectric substrate 710. Further, the main line 11, the sub line 12, a switch, and a control unit are formed on or in the semiconductor substrate 720. Further, as illustrated in FIGS. 8B and 8C, each of the dielectric substrate 710 and the semiconductor substrate 720 is connected to the terminal substrate 730 by bump electrodes, for example. A resin member 740 is formed on a main surface of the terminal substrate 730 to which the dielectric substrate 710 and the semiconductor substrate 720 are attached, so as to cover the dielectric substrate 710 and the semiconductor substrate 720.

Since a substrate material with a low loss and a high dielectric constant is selected for the dielectric substrate 710, the lines 71 to 76 of the distributed constant type can be miniaturized and reduced in loss, so that the variable filter 70 can be miniaturized and reduced in loss.

Further, by appropriately selecting a dielectric constant of the semiconductor substrate 720, respective electric lengths of the main line 11 and the sub line 12 can be optimized, and fine machining of the main line 11 and the sub line 12 can be performed with high accuracy. Thus, it is possible to suppress characteristic variation in the directional coupler 1.

On the other hand, although on-resistance of each switch formed on or in the semiconductor substrate 720 tends to rise, each switch can be connected to the sub line 12 instead of the main line 11, so that influence of high on-resistance can be suppressed.

Note that, the lines 71 to 76 may be formed on or in the semiconductor substrate 720 instead of the dielectric substrate 710. In this case, a silicon substrate having a high resistance as the semiconductor substrate 720 can be used, and by adopting SOI structure provided with an insulator layer, it is possible to increase a Q value of each line, thereby reducing the variable filter 70 in loss. Further, connection with each switch formed on or in the semiconductor substrate 720 is facilitated, thereby improving reliability.

Further, the lines 71 to 76 of the distributed constant type may be formed on or in the terminal substrate 730 instead of the dielectric substrate 710. In this case, a resin substrate or a dielectric ceramic substrate having a relatively low loss as the terminal substrate 730 can be used. In this case, by reducing a dielectric constant of the terminal substrate 730, a conductor loss of the line of the distributed constant type can be reduced without necessarily excessively reducing impedance of a resonator, so that the variable filter 70 can be reduced in loss. Further, by increasing the dielectric constant of the terminal substrate 730, the line of the distributed constant type can be miniaturized, so that the variable filter 70 can be miniaturized.

Embodiment 2

In the present embodiment, a configuration of a directional coupler 2 will be illustrated in which a variable termination circuit, a variable matching circuit, and a variable attenuator are further added to the directional coupler 1 according to Embodiment 1.

2.1 Circuit Configuration of Directional Coupler

Figure 9:
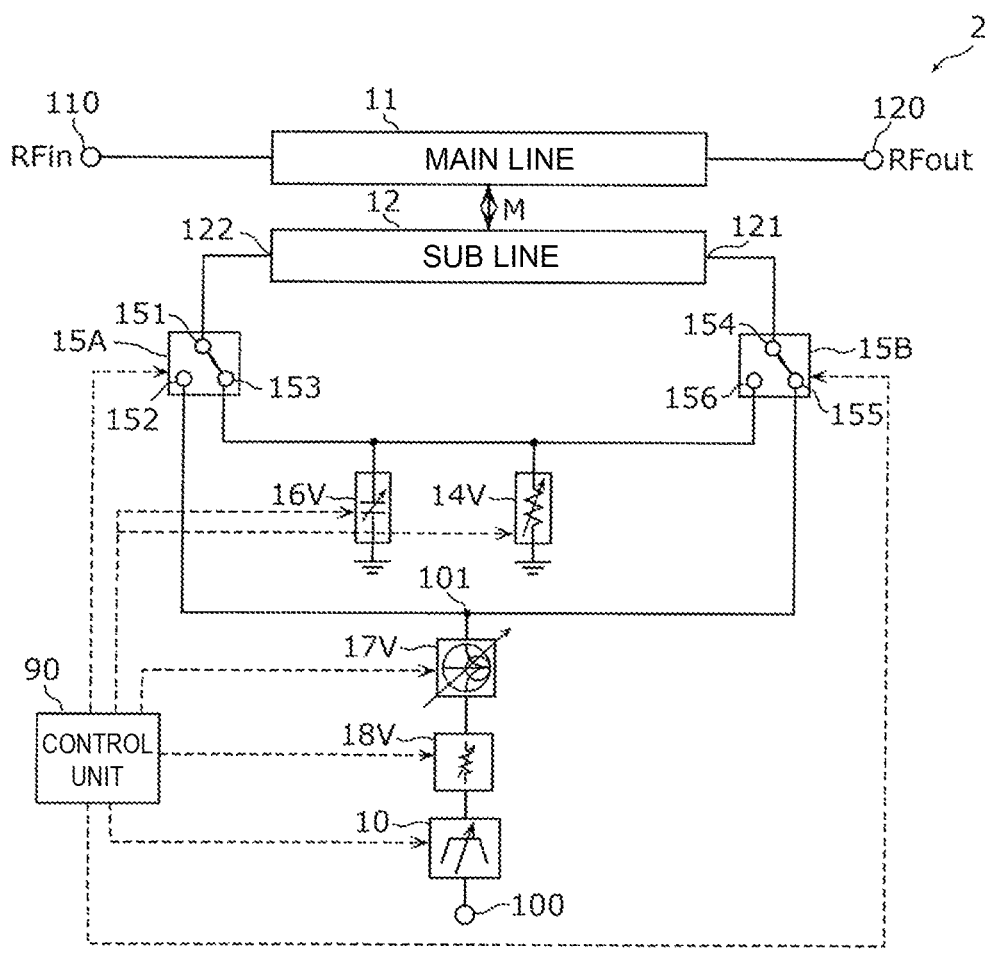
FIG. 9 is a circuit diagram illustrating an example of a functional configuration of a directional coupler according to Embodiment 2.

FIG. 9 is a circuit diagram illustrating an example of a functional configuration of the directional coupler 2 according to Embodiment 2. As illustrated in the figure, the directional coupler 2 includes the main line 11, the sub line 12, the variable filter 10, variable termination circuits 14V and 16V, the switches 15A and 15B, a variable matching circuit 17V, a variable attenuator 18V, and a control unit 90. The main line 11 and the sub line 12 are electromagnetically coupled to each other as indicated by an arrow M in FIG. 9. The directional coupler 2 according to the present embodiment is different from the directional coupler 1 according to Embodiment 1 in that the variable termination circuits 14V and 16V are added instead of the terminal circuit 14, and further, the variable matching circuit 17V, the variable attenuator 18V, and the control unit 90 are added. Hereinafter, the same configuration as that of the directional coupler 1 according to Embodiment 1 will not be described, and a different configuration will be mainly described below with respect to the directional coupler 2 according to the present embodiment.

Each of the variable termination circuits 14V and 16V is connected to the switches 15A and 15B. The variable termination circuit 14V is connected to the other end portion 122 with the switch 15A interposed therebetween, and is connected to the one end portion 121 with the switch 15B interposed therebetween. Further, the variable termination circuit 16V is connected to the other end portion 122 with the switch 15A interposed therebetween, and is connected to the one end portion 121 with the switch 15B interposed therebetween. The variable termination circuits 14V and 16V constitute a termination circuit of the directional coupler 2.

The variable termination circuit 14V has a variable resistance element for varying termination impedance of the termination circuit. Further, the variable termination circuit 16V has a variable capacitance element for varying termination impedance of the termination circuit.

According to the configuration of the variable termination circuits 14V and 16V, since a resistance value of the variable resistance element and a capacitance value of the variable capacitance element can be varied in accordance with a frequency band of a high frequency signal to be detected, appropriate directivity and isolation can be optimized in accordance with the frequency band. Note that, a filter characteristic of the variable filter 10 can be adjusted in correspondence to the terminal impedance adjusted by the termination circuit. Thus, influence on the filter characteristic of the variable filter 10, due to connection of the variable termination circuits 14V and 16V, can be canceled.

The variable resistance element of the variable termination circuit 14V is composed of, for example, a plurality of resistance elements and a switch. Note that, the plurality of resistance elements may be formed on a semiconductor substrate, or may be separately mounted as a chip component.

Further, the variable capacitance element of the variable termination circuit 16V is composed of, for example, a plurality of capacitors connected in parallel to each other. Note that, the plurality of capacitors may be an MIM capacitor formed on a semiconductor substrate, a capacitor configured with opposing comb-shaped electrodes, or may be separately mounted as a chip component. Further, the variable capacitance element may be an MEMS type capacitor having a mechanism for continuously varying an overlapping area of opposing electrodes.

The variable matching circuit 17V is disposed between the sub line 12 and the variable filter 10. In the present embodiment, an input end of the variable matching circuit 17V is connected to the selection terminals 152 and 155, and an output end thereof is connected to the variable filter 10 with the variable attenuator 18V interposed therebetween. The variable matching circuit 17V is composed of, for example, passive elements such as an inductor and a capacitor, and a switch. The variable matching circuit 17V can match impedance when a side of the sub line 12 is viewed from the variable matching circuit 17V, with input impedance of the variable filter 10, by varying impedance and a phase according to a frequency band to be detected.

With this, it is possible to realize appropriate directivity and isolation according to a frequency band of a high frequency signal to be detected. Note that, a filter characteristic of the variable filter 10 can be adjusted in correspondence to the impedance adjusted by the variable matching circuit 17V. Thus, influence on the filter characteristic of the variable filter 10 due to connection of the variable matching circuit 17V can be canceled.

Note that, it is sufficient that the variable matching circuit 17V is connected to the other end portion 122 with the switch 15A interposed therebetween, and is connected to the one end portion 121 with the switch 15B interposed therebetween. For example, the variable matching circuit 17V may also be connected to the output terminal 100 of the variable filter 10. In this case, the variable matching circuit 17V can match the impedance when the side of the sub line 12 is viewed from the variable matching circuit 17V with impedance when a side of the output terminal 100 is viewed from the variable matching circuit 17V.

The variable attenuator 18V is connected between the variable matching circuit 17V and the variable filter 10. By adjusting an attenuation factor of the variable attenuator 18V, an insertion loss of the variable filter 10 that varies in accordance with a frequency band to be detected can be compensated, magnitude of a detection signal at the output terminal 100 can be leveled, and the detection accuracy can be stabilized.

Note that, it is sufficient that the variable attenuator 18V is connected to the other end portion 122 with the switch 15A interposed therebetween, and is connected to the one end portion 121 with the switch 15B interposed therebetween. For example, the variable attenuator 18V may also be connected to the output terminal 100 of the variable filter 10.

The control unit 90 controls each switch included in the variable filter 10 so as to shift a pass band or a stop band of the variable filter 10. Further, the control unit 90 controls the switches 15A and 15B so as to select a detection terminal (coupling port) in the sub line 12. In addition, the control unit 90 sets a resistance value of the variable resistance element of the variable termination circuit 14V, and a capacitance value of the variable capacitance element of the variable termination circuit 16V in accordance with a frequency band to be detected. In addition, the control unit 90 sets impedance and a phase of the variable matching circuit 17V in accordance with a frequency band to be detected. Further, the control unit 90 sets an attenuation factor of a variable attenuator in accordance with a frequency band to be detected.

The control unit 90 is configured with, for example, a level shifter for opening/closing each switch based on selection information of a frequency band to be detected, an interface unit for performing serial communication with an outside or General Purpose Input/Output (GPIO) communication, a memory unit for storing information, a logic unit or a processor unit for processing signals/information, and a power supply unit for switch driving and for driving each unit.

According to the above configuration of the control unit 90, it is possible to selectively output a high frequency signal in a desired frequency band to the output terminal 100, among high frequency signals in a plurality of frequency bands transmitted in the main line 11.

Note that, the control unit 90 need not be included in the directional coupler 2, or may be included in an external circuit connected to the directional coupler 2. The control unit 90 may be built in, for example, a high frequency signal processing circuit (RFIC).

Third Embodiment

In the present embodiment, compared to the directional coupler 1 according to Embodiment 1, the directional coupler 2 including a plurality of variable filters, and having a configuration for bypassing the variable filters will be described.

3.1 Circuit Configuration of Directional Coupler

Figure 10:
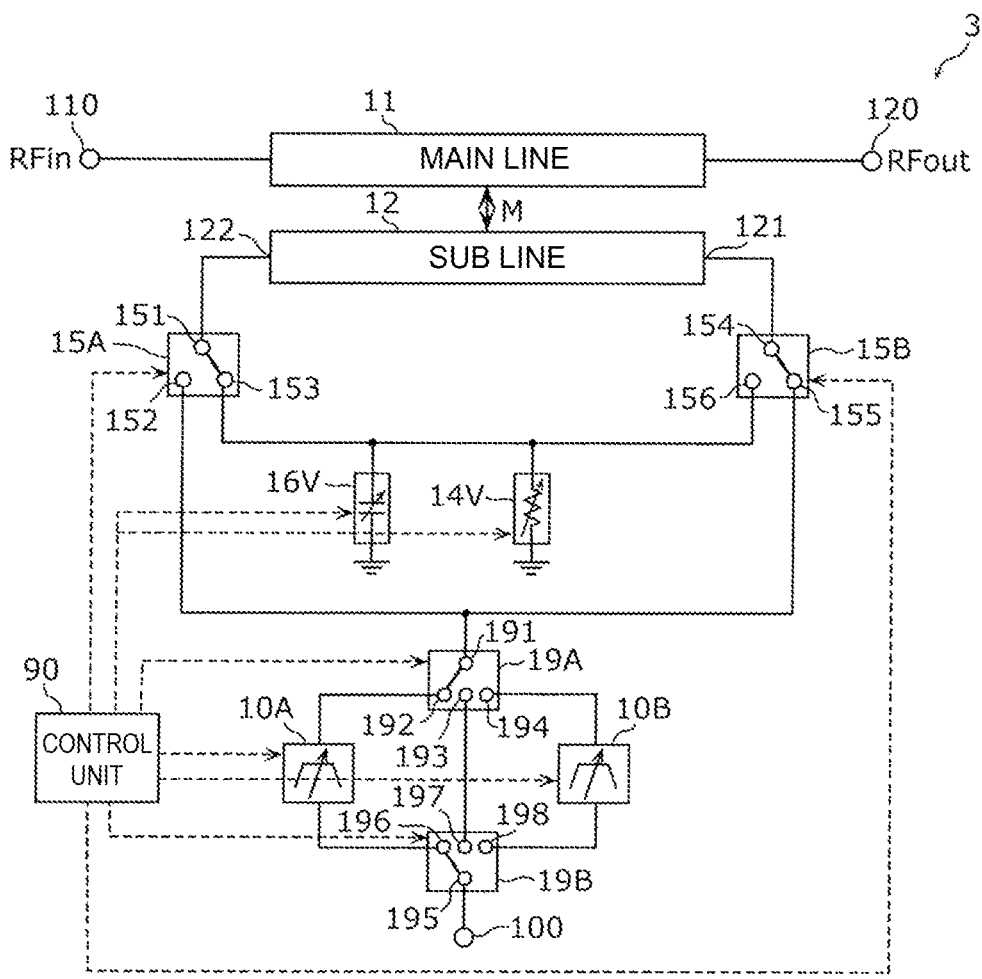
FIG. 10 is a circuit diagram illustrating an example of a functional configuration of a directional coupler according to Embodiment 3.

FIG. 10 is a circuit diagram illustrating an example of a functional configuration of the directional coupler 3 according to Embodiment 3. As illustrated in the figure, the directional coupler 3 includes the main line 11, the sub line 12, variable filters 10A and 10B, the variable termination circuits 14V and 16V, the switches 15A, 15B, switches 19A, 19B, and the control unit 90. The main line 11 and the sub line 12 are electromagnetically coupled to each other as indicated by an arrow M in FIG. 9. The directional coupler 3 according to the present embodiment is different from the directional coupler 1 according to Embodiment 1 in that, the variable termination circuits 14V and 16V are added instead of the termination circuit 14, a plurality of variable filters is disposed, and a configuration for bypassing the variable filters is added, and the control unit 90 is added. Hereinafter, the same configuration as that of the directional coupler 1 according to Embodiment 1 will not be described, and a different configuration will be mainly described below with respect to the directional coupler 3 according to the present embodiment.

Since the variable termination circuits 14V and 16V have a similar configuration to that of the variable termination circuits 14V and 16V included in the directional coupler 2 according to Embodiment 2, the description thereof will be omitted.

The switch 19A is a third switch circuit having a common terminal 191, and selection terminals 192, 193, and 194, and is disposed between each of the variable filters 10A and 10B, and the sub line 12. Further, the switch 19B has a common terminal 195, and selection terminals 196, 197, and 198, and is disposed between each of the switches 15A and 15B, and the output terminal 100.

Each of the variable filters 10A and 10B has a configuration similar to that of the variable filter 10 according to Embodiment 1, and is a filter unit circuit with one continuous frequency band being a pass band or a stop band, and a switch for shifting frequencies in the pass band is disposed in the filter unit circuit. Note that, the pass band or the stop band included in the variable filter 10A, are different from the pass band or the stop band of the variable filter 10B. In other words, the pass band (or the stop band) of the variable filter 10A does not include a frequency band included in the pass band (or the stop band) of the variable filter 10B, at the same time. For example, when the pass band of the variable filter is set at a frequency band A, the pass band of the variable filter is set at a frequency band B, which is a different frequency band from the frequency band A. However, the pass band of the variable filter 10A can be shifted to the frequency band B when the pass band of the variable filter 10B has been shifted into or the frequency band A, or, when the pass band of the variable filter 10B has been shifted into a frequency band C which is different from the frequency band A or the frequency band B.

For example, specific connection configuration is as follows. The common terminal 191 is connected to the selection terminals 152 and 155, the selection terminal 192 is connected to an input end of the variable filter 10A, and the selection terminal 194 is connected to an input end of the variable filter 10B. Further, the common terminal 195 is connected to the output terminal 100, the selection terminal 196 is connected to an output end of the variable filter 10A, and the selection terminal 198 is connected to an output end of the variable filter 10B. Further, the selection terminal 193 and the selection terminal 197 are directly connected to each other.

According to the above configuration, the switches 19A and 19B switch paths for a high frequency signal transmitted in the sub line 12, the paths including (1) a path (first path) passing through the variable filter 10A, (2) a path (first path) passing through the variable filter 10B, and (3) a path (second path) passing through a bypass line without necessarily passing through the variable filters 10A and 10B. Accordingly, when (3) the path passing through the bypass line without necessarily passing through the variable filters 10A and 10B is selected, an insertion loss in the variable filters 10A and 10B can be monitored, by comparing an insertion loss in (1) the path passing through the variable filter 10A, and an insertion loss in (2) the path passing through the variable filter 10B, with an insertion loss in (3) the path passing through the bypass line without necessarily passing through the variable filters 10A and 10B, and a high frequency signal can be detected with substantially no loss.

Further, by disposing a plurality of filters including the variable filter 10A, it is possible to improve detection accuracy of a high frequency signal over a wide frequency band. Further, since at least the single variable filter 10A is included as compared with a directional coupler constituted by only filters each having a fixed pass band, the directional coupler 3 can be miniaturized.

Note that, although the directional coupler 3 according to the present embodiment is configured to have the two variable filters, it is sufficient that at least one variable filter is included, and in this view, a filter with a pass band and a stop band fixed may be disposed in place of the variable filter 10B.

In addition, the switch 19B need not be provided, and in this case, a plurality of output terminals is to be included.

Further, instead of the switches 19A and 19B, a diplexer may be disposed, for example.

Further, a plurality of filters including a variable filter may be disposed in series instead of in parallel.

Although the control unit 90 has a similar configuration to that of the control unit 90 according to Embodiment 2, the control unit 90 further controls the switches 19A and 19B in accordance with a frequency band to be detected, compared to the control unit 90 according to Embodiment 2.

Other Embodiments and the Like

Although the directional coupler according to the present embodiment has been described with reference to the embodiment and the modification example, the directional couplers according to embodiments of the present disclosure are not limited to the above embodiments and the modification examples. Other embodiments realized by combining arbitrary components in the above embodiments and modification examples, and modification examples obtained by applying various modifications which will occur to those skilled in the art without necessarily departing from the gist of the present disclosure for the above embodiments and modification examples, and various devices incorporating the above-described directional couplers are also included in the present disclosure.

For example, in the directional couplers according to the embodiments and the modification examples thereof, another circuit element, wiring, and the like, may be inserted between a path connecting the circuit elements and the signal path disclosed in the drawings.

INDUSTRIAL APPLICABILITY

The present disclosure is widely available as a directional coupler.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A directional coupler, comprising:
a main line configured to transmit a high frequency signal;
a sub line electromagnetically coupled to the main line;
a termination circuit configured to terminate a first end portion of the sub line; and
a single variable filter having an input terminal and an output terminal, the input terminal being connected to a second end portion of the sub line,
wherein the single variable filter is a filter circuit comprising a variable passive element configured to shift a frequency in a pass band or a stop band of the single variable filter.

2. The directional coupler according to claim 1, wherein the variable passive element comprises a switch and a passive element connected to the switch.

3. The directional coupler according to claim 2, wherein:
the passive element is a lumped constant type inductor having a spiral-shaped planar coil pattern.

4. The directional coupler according to claim 3, wherein:
the inductor has a first terminal, a second terminal, and a third terminal, has a first inductance value between the first terminal and the third terminal, and has a second inductance value between the second terminal and the third terminal, the second inductance value being different from the first inductance value, and
the first terminal or the second terminal is connected to the switch.

5. The directional coupler according to claim 1, wherein no filter other than the single variable filter is connected to the second end portion of the sub line.

6. The directional coupler according to claim 1, further comprising a filter that is connected to the second end portion, the filter having a pass band different from the pass band of the single variable filter.

7. The directional coupler according to claim 1, further comprising:
a first switch circuit that has a first common terminal, a first selection terminal, and a second selection terminal, and that is disposed between the second end portion of the sub line and the single variable filter; and
a second switch circuit that has a second common terminal, a third selection terminal, and a fourth selection terminal, and that is disposed between the first end portion of the subline and the termination circuit, wherein:
the second end portion of the sub line is connected to the first common terminal,
the input terminal is connected to the first selection terminal and to the third selection terminal, and
the termination circuit is connected to the fourth selection terminal and to the second selection terminal.

8. The directional coupler according to claim 1, wherein the termination circuit comprises a variable element configured to vary a termination impedance of the termination circuit.

9. The directional coupler according to claim 1, further comprising a third switch circuit that is disposed between the single variable filter and the sub line, and that is configured to switch paths for a high frequency signal transmitted in the sub line,
wherein the paths include a first path passing through the single variable filter, and a second path passing through a bypass line without passing through the single variable filter.

10. The directional coupler according to claim 1, further comprising a variable attenuator connected to the second end portion.

11. The directional coupler according to claim 1, further comprising a variable matching circuit connected to the second end portion.

12. The directional coupler according to claim 1, wherein the main line and the sub line are on or in a semiconductor substrate.

13. The directional coupler according to claim 12, wherein a passive element or a switch of the single variable filter is on or in the semiconductor substrate.

* * * * *

UNITED STATES PATENT AND TRADEMARK OFFICE
CERTIFICATE OF CORRECTION

| | |
|---|---|
| PATENT NO. | : 11,121,444 B2 |
| APPLICATION NO. | : 16/552360 |
| DATED | : September 14, 2021 |
| INVENTOR(S) | : Kenta Seki et al. |

Page 1 of 1

It is certified that error appears in the above-identified patent and that said Letters Patent is hereby corrected as shown below:

In the Specification

Column 6, Line 51, "lilt" should be -- 111t --.

Column 6, Line 59, "ill" should be -- 111 --.

Signed and Sealed this
Twenty-eighth Day of June, 2022

Katherine Kelly Vidal
*Director of the United States Patent and Trademark Office*